United States Patent
Iyengar et al.

(10) Patent No.: US 10,681,846 B2
(45) Date of Patent: Jun. 9, 2020

(54) COOLING ELECTRONIC DEVICES IN A DATA CENTER

(71) Applicant: Google LLC, Mountain View, CA (US)

(72) Inventors: Madhusudan Krishnan Iyengar, Foster City, CA (US); Christopher Gregory Malone, Mountain View, CA (US); Yuan Li, Sunnyvale, CA (US); Jorge Padilla, Union City, CA (US); Woon-Seong Kwon, Santa Clara, CA (US); Teckgyu Kang, Saratoga, CA (US); Norman Paul Jouppi, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/957,161

(22) Filed: Apr. 19, 2018

(65) Prior Publication Data
US 2019/0327859 A1  Oct. 24, 2019

(51) Int. Cl.
*H05K 7/20* (2006.01)
*H01L 23/473* (2006.01)

(52) U.S. Cl.
CPC ........ *H05K 7/20772* (2013.01); *H01L 23/473* (2013.01); *H05K 7/20218* (2013.01); *H05K 7/20254* (2013.01); *H05K 7/20636* (2013.01)

(58) Field of Classification Search
CPC .......... H05K 7/20218; H05K 7/20254; H05K 7/20636; H05K 7/20772; H01L 23/473
USPC ....................... 361/679.46–679.54, 688–723; 165/80.4–80.5, 104.33; 257/714
See application file for complete search history.

(56) References Cited

U.S. PATENT DOCUMENTS

| | | | |
|---|---|---|---|
| 5,774,334 A * | 6/1998 | Kawamura | H01L 23/4338 165/80.4 |
| 6,292,365 B1 * | 9/2001 | Ashiwake | H01L 23/473 165/104.21 |
| 6,317,326 B1 | 11/2001 | Vogel | |
| 6,388,882 B1 | 5/2002 | Hoover et al. | |
| 6,952,346 B2 | 10/2005 | Tilton et al. | |
| 6,973,801 B1 | 12/2005 | Campbell et al. | |
| 7,086,247 B2 | 8/2006 | Campbell et al. | |

(Continued)

OTHER PUBLICATIONS

Alavi et al. "Fabrications of microchannels by laser machining and anisotropic," Sensor and Actuators A: Physical, vol. 32, Issues 1-3, Apr. 1992, 4 pages.

(Continued)

*Primary Examiner* — Zachary Pape
(74) *Attorney, Agent, or Firm* — Fish & Richardson P.C.

(57) ABSTRACT

A server tray package includes a motherboard assembly that includes a plurality of data center electronic devices, the plurality of data center electronic devices including at least one heat generating processor device; and a liquid cold plate assembly. The liquid cold plate assembly includes a base portion mounted to the motherboard assembly, the base portion and motherboard assembly defining a volume that at least partially encloses the plurality of data center electronic devices; and a top portion mounted to the base portion and including a heat transfer member shaped to thermally contact the heat generating processor device, the heat transfer member including an inlet port and an outlet port that are in fluid communication with a cooling liquid flow path defined through the heat transfer member.

28 Claims, 7 Drawing Sheets

(56) References Cited

U.S. PATENT DOCUMENTS

| | | |
|---|---|---|
| 7,233,494 B2 | 6/2007 | Campbell et al. |
| 7,272,005 B2 | 9/2007 | Campbell et al. |
| 7,274,566 B2 | 9/2007 | Campbell et al. |
| 7,277,283 B2 | 10/2007 | Campbell et al. |
| 7,298,617 B2 | 11/2007 | Campbell et al. |
| 7,298,618 B2 | 11/2007 | Campbell et al. |
| 7,301,770 B2 | 11/2007 | Campbell et al. |
| 7,349,213 B2 | 3/2008 | Campbell et al. |
| 7,362,574 B2 | 4/2008 | Campbell et al. |
| 7,375,962 B2 | 5/2008 | Campbell et al. |
| 7,380,409 B2 | 6/2008 | Campbell et al. |
| 7,385,817 B2 | 6/2008 | Campbell et al. |
| 7,400,504 B2 | 7/2008 | Campbell et al. |
| 7,400,505 B2 | 7/2008 | Campbell et al. |
| 7,405,936 B1 | 7/2008 | Campbell et al. |
| 7,408,776 B2 | 8/2008 | Campbell et al. |
| 7,420,808 B2 | 9/2008 | Campbell et al. |
| 7,450,385 B1 | 11/2008 | Campbell et al. |
| 7,486,514 B2 | 2/2009 | Campbell et al. |
| 7,511,957 B2 | 3/2009 | Campbell et al. |
| 7,516,776 B2 | 4/2009 | Bezama et al. |
| 7,518,871 B2 | 4/2009 | Campbell et al. |
| 7,593,227 B2 | 9/2009 | Campbell et al. |
| 7,609,519 B2 | 10/2009 | Campbell et al. |
| 7,639,498 B2 | 12/2009 | Campbell et al. |
| 7,639,499 B1 | 12/2009 | Campbell et al. |
| 7,641,101 B2 | 1/2010 | Campbell et al. |
| 7,651,260 B2 | 1/2010 | Hamann et al. |
| 7,665,325 B2 | 3/2010 | Campbell et al. |
| 7,724,524 B1 | 5/2010 | Campbell et al. |
| 7,731,079 B2 | 6/2010 | Campbell et al. |
| 7,762,314 B2 | 7/2010 | Campbell et al. |
| 7,787,248 B2 | 8/2010 | Campbell et al. |
| 7,791,882 B2 | 9/2010 | Chu et al. |
| 7,808,781 B2 | 10/2010 | Colgan et al. |
| 7,830,664 B2 | 11/2010 | Campbell et al. |
| 7,841,385 B2 | 11/2010 | Campbell et al. |
| 7,885,074 B2 | 2/2011 | Campbell et al. |
| 7,905,096 B1 | 3/2011 | Campbell et al. |
| 7,907,406 B1 | 3/2011 | Campbell et al. |
| 7,916,483 B2 | 3/2011 | Campbell et al. |
| 7,948,757 B2 | 5/2011 | Campbell et al. |
| 7,963,119 B2 | 6/2011 | Campbell et al. |
| 7,965,509 B2 | 6/2011 | Campbell et al. |
| 7,967,062 B2 | 6/2011 | Campbell et al. |
| 7,978,472 B2 | 7/2011 | Campbell et al. |
| 7,978,473 B2 | 7/2011 | Campbell et al. |
| 7,990,709 B2 | 8/2011 | Campbell et al. |
| 7,992,627 B2 | 8/2011 | Bezama et al. |
| 8,014,150 B2 | 9/2011 | Campbell et al. |
| 8,018,720 B2 | 9/2011 | Campbell et al. |
| 8,027,162 B2 | 9/2011 | Campbell et al. |
| 8,029,186 B2 | 10/2011 | Hamann et al. |
| 8,038,343 B2 | 10/2011 | Hamann et al. |
| 8,051,897 B2 | 11/2011 | Campbell et al. |
| 8,056,615 B2 | 11/2011 | Downing |
| 8,059,405 B2 | 11/2011 | Campbell et al. |
| 8,077,462 B2 | 12/2011 | Barringer et al. |
| 8,094,453 B2 | 1/2012 | Campbell et al. |
| 8,144,467 B2 | 3/2012 | Campbell et al. |
| 8,179,674 B2 | 5/2012 | Carter et al. |
| 8,179,677 B2 | 5/2012 | Campbell et al. |
| 8,189,334 B2 | 5/2012 | Campbell et al. |
| 8,194,406 B2 | 6/2012 | Campbell et al. |
| 8,203,842 B2 | 6/2012 | Campbell et al. |
| 8,208,258 B2 | 6/2012 | Campbell et al. |
| 8,210,741 B2 | 7/2012 | Hamann et al. |
| 8,230,906 B2 | 7/2012 | Campbell et al. |
| 8,248,801 B2 | 8/2012 | Campbell et al. |
| 8,266,802 B2 | 9/2012 | Campbell et al. |
| 8,274,790 B2 | 9/2012 | Campbell et al. |
| 8,279,597 B2 | 10/2012 | El-Essawy et al. |
| 8,322,029 B2 | 12/2012 | Campbell et al. |
| 8,322,154 B2 | 12/2012 | Campbell et al. |
| 8,345,423 B2 | 1/2013 | Campbell et al. |
| 8,358,503 B2 | 1/2013 | Carter et al. |
| 8,369,091 B2 | 2/2013 | Campbell et al. |
| 8,387,249 B2 | 3/2013 | Campbell et al. |
| 8,437,129 B2 | 5/2013 | Tung |
| 8,472,182 B2 | 6/2013 | Campbell et al. |
| 8,490,679 B2 | 7/2013 | Campbell et al. |
| 8,493,738 B2 | 7/2013 | Chainer et al. |
| 8,547,692 B2 | 10/2013 | El-Essawy et al. |
| 8,564,952 B2 | 10/2013 | Campbell et al. |
| 8,583,290 B2 | 11/2013 | Campbell et al. |
| 8,619,425 B2 | 12/2013 | Campbell et al. |
| 8,636,406 B2 | 1/2014 | Hamann et al. |
| 8,649,177 B2 | 2/2014 | Chainer et al. |
| 8,687,364 B2 | 4/2014 | Chainer et al. |
| 8,689,861 B2 | 4/2014 | Campbell et al. |
| 8,711,563 B2 | 4/2014 | Campbell et al. |
| 8,713,955 B2 | 5/2014 | Campbell et al. |
| 8,713,957 B2 | 5/2014 | Campbell et al. |
| 8,739,406 B2 | 6/2014 | Campbell et al. |
| 8,743,545 B2 | 6/2014 | Campbell et al. |
| 8,760,863 B2 | 6/2014 | Campbell et al. |
| 8,783,052 B2 | 7/2014 | Campbell et al. |
| 8,789,385 B2 | 7/2014 | Campbell et al. |
| 8,797,740 B2 | 8/2014 | Campbell et al. |
| 8,806,749 B2 * | 8/2014 | Campbell .......... H05K 7/20745 165/104.21 |
| 8,813,515 B2 | 8/2014 | Campbell et al. |
| 8,817,465 B2 | 8/2014 | Campbell et al. |
| 8,817,474 B2 | 8/2014 | Campbell et al. |
| 8,824,143 B2 | 9/2014 | Campbell et al. |
| 8,833,096 B2 | 9/2014 | Campbell et al. |
| 8,879,257 B2 | 11/2014 | Campbell et al. |
| 8,899,052 B2 | 12/2014 | Campbell et al. |
| 8,913,384 B2 | 12/2014 | David et al. |
| 8,922,998 B2 | 12/2014 | Campbell et al. |
| 8,925,333 B2 | 1/2015 | Campbell et al. |
| 8,929,080 B2 | 1/2015 | Campbell et al. |
| 8,934,250 B2 | 1/2015 | Campbell et al. |
| 8,941,994 B2 | 1/2015 | Campbell et al. |
| 8,947,873 B2 | 2/2015 | Campbell et al. |
| 8,953,317 B2 | 2/2015 | Campbell et al. |
| 8,955,346 B2 | 2/2015 | Campbell et al. |
| 8,964,390 B2 | 2/2015 | Campbell et al. |
| 8,964,391 B2 | 2/2015 | Campbell et al. |
| 8,966,922 B2 | 3/2015 | Campbell et al. |
| 8,985,847 B2 | 3/2015 | Campbell et al. |
| 9,009,968 B2 | 4/2015 | Campbell et al. |
| 9,009,971 B2 | 4/2015 | Campbell et al. |
| 9,013,872 B2 | 4/2015 | Campbell et al. |
| 9,027,360 B2 | 5/2015 | Chainer et al. |
| 9,038,406 B2 | 5/2015 | Campbell et al. |
| 9,043,035 B2 | 5/2015 | Chainer et al. |
| 9,045,995 B2 | 6/2015 | Graybill et al. |
| 9,052,722 B2 | 6/2015 | Chainer et al. |
| 9,078,379 B2 | 7/2015 | Campbell et al. |
| 9,095,889 B2 | 8/2015 | Campbell et al. |
| 9,095,942 B2 | 8/2015 | Campbell et al. |
| 9,101,078 B2 | 8/2015 | Campbell et al. |
| 9,110,476 B2 | 8/2015 | David et al. |
| 9,148,982 B2 | 9/2015 | Campbell et al. |
| 9,148,983 B2 | 9/2015 | Campbell et al. |
| 9,167,721 B2 | 10/2015 | Campbell et al. |
| 9,173,324 B2 | 10/2015 | Campbell et al. |
| 9,179,574 B2 | 11/2015 | Canney et al. |
| 9,185,830 B2 | 11/2015 | Chainer et al. |
| 9,200,851 B2 | 12/2015 | Campbell et al. |
| 9,207,002 B2 | 12/2015 | Campbell et al. |
| 9,210,830 B2 | 12/2015 | Campbell et al. |
| 9,213,343 B2 | 12/2015 | Campbell et al. |
| 9,218,008 B2 | 12/2015 | Campbell et al. |
| 9,250,024 B2 | 2/2016 | Campbell et al. |
| 9,253,921 B2 | 2/2016 | Campbell et al. |
| 9,261,308 B2 | 2/2016 | Campbell et al. |
| 9,282,675 B2 | 3/2016 | Campbell et al. |
| 9,282,678 B2 | 3/2016 | Campbell et al. |
| 9,285,050 B2 | 3/2016 | Campbell et al. |
| 9,288,932 B2 | 3/2016 | Campbell et al. |
| 9,291,281 B2 | 3/2016 | Campbell et al. |
| 9,295,181 B2 | 3/2016 | Campbell et al. |

(56) References Cited

U.S. PATENT DOCUMENTS

| | | | |
|---|---|---|---|
| 9,301,433 B2 | 3/2016 | Campbell et al. |
| 9,303,926 B2 | 4/2016 | Campbell et al. |
| 9,307,674 B2 | 4/2016 | Chainer et al. |
| 9,313,920 B2 | 4/2016 | Campbell et al. |
| 9,332,674 B2 | 5/2016 | Campbell et al. |
| 9,338,924 B2 | 5/2016 | Campbell et al. |
| 9,342,079 B2 | 5/2016 | David et al. |
| 9,351,431 B2 | 5/2016 | Campbell et al. |
| 9,357,674 B2 | 5/2016 | Campbell et al. |
| 9,357,675 B2 | 5/2016 | Campbell et al. |
| 9,357,682 B2 | 5/2016 | Campbell et al. |
| 9,363,924 B2 | 6/2016 | Campbell et al. |
| 9,386,727 B2 | 7/2016 | Barringer et al. |
| 9,410,751 B2 | 8/2016 | David et al. |
| 9,414,519 B2 | 8/2016 | Campbell et al. |
| 9,414,523 B2 | 8/2016 | Chainer et al. |
| 9,414,525 B2 | 8/2016 | Campbell et al. |
| 9,439,325 B2 | 9/2016 | Campbell et al. |
| 9,445,529 B2 | 9/2016 | Chainer et al. |
| 9,460,985 B2 | 10/2016 | Joshi et al. |
| 9,470,439 B2 | 10/2016 | Campbell et al. |
| 9,474,186 B2 | 10/2016 | Campbell et al. |
| 9,518,875 B2 | 12/2016 | Chainer et al. |
| 9,655,282 B2 | 5/2017 | Barringer et al. |
| 9,686,889 B2 | 6/2017 | Campbell et al. |
| 9,719,865 B2 | 8/2017 | Chainer et al. |
| 9,750,159 B2 | 8/2017 | Campbell et al. |
| 9,763,357 B2 | 9/2017 | Campbell et al. |
| 9,831,151 B1 | 11/2017 | Schultz |
| 9,879,926 B2 | 1/2018 | David et al. |
| 2003/0147214 A1 | 8/2003 | Patel et al. |
| 2004/0061218 A1 | 4/2004 | Tilton |
| 2007/0023879 A1 | 2/2007 | Pandey et al. |
| 2007/0121295 A1 | 5/2007 | Campbell et al. |
| 2007/0125523 A1 | 6/2007 | Bhatti et al. |
| 2009/0140417 A1 | 6/2009 | Refai-Ahmed |
| 2009/0218078 A1 | 9/2009 | Brunschwiler et al. |
| 2010/0252234 A1 | 10/2010 | Campbell |
| 2011/0240281 A1 | 10/2011 | Avery |
| 2013/0027878 A1 | 1/2013 | Campbell |
| 2013/0027884 A1 | 1/2013 | Campbell et al. |
| 2014/0015106 A1 | 1/2014 | Hsieh |
| 2014/0085817 A1 | 3/2014 | Campbell et al. |
| 2014/0146467 A1 | 5/2014 | Campbell |
| 2015/0319883 A1 | 11/2015 | Branton |
| 2016/0262288 A1 | 9/2016 | Chainer et al. |
| 2016/0338226 A1 | 11/2016 | Sakamoto et al. |
| 2017/0127565 A1 | 5/2017 | Campbell |
| 2018/0005921 A1 | 1/2018 | Takemura et al. |
| 2018/0090417 A1* | 3/2018 | Gutala ............... G06F 17/5081 |
| 2018/0211900 A1* | 7/2018 | Gutala ............... H01L 23/473 |
| 2019/0103290 A1 | 4/2019 | Medina |
| 2019/0206764 A1 | 7/2019 | Kulkarni |

OTHER PUBLICATIONS

PCT International Search Report and Written Opinion in International Application No. PCT/US2019/028109, dated Jun. 28, 2019, 14 pages.

PCT International Search Report and Written Opinion in International Application No. PCT/US2019/027909, dated Aug. 13, 2019, 14 pages.

PCT International Search Report and Written Opinion in International Application No. PCT/US2019/046794, dated Nov. 15, 2019, 15 pages.

* cited by examiner

COOLING ELECTRONIC DEVICES IN A DATA CENTER

TECHNICAL FIELD

This document relates to systems and methods for providing cooling to electronic equipment, such as computer server racks and related equipment in computer data centers, with a cold plate.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

This disclosure describes a cooling system, for example, for rack mounted electronic devices (e.g., servers, processors, memory, networking devices or otherwise) in a data center. In various disclosed implementations, the cooling system may be or include a liquid cold plate assembly that is part of or integrated with a server tray package. In some implementations, the liquid cold plate assembly includes a base portion and a top portion that, in combination, form a cooling liquid flow path through which a cooling liquid is circulated and a thermal interface between one or more heat generating devices and the cooling liquid.

In an example implementation, a server tray package includes a motherboard assembly that includes a plurality of data center electronic devices, the plurality of data center electronic devices including at least one heat generating processor device; and a liquid cold plate assembly. The liquid cold plate assembly includes a base portion mounted to the motherboard assembly, the base portion and motherboard assembly defining a volume that at least partially encloses the plurality of data center electronic devices; and a top portion mounted to the base portion and including a heat transfer member shaped to thermally contact the heat generating processor device, the heat transfer member including an inlet port and an outlet port that are in fluid communication with a cooling liquid flow path defined through the heat transfer member.

In an aspect combinable with the example implementation further includes a first thermal interface material positioned between a bottom surface of the top portion and a top surface of the base portion.

Another aspect combinable with any one of the previous aspects further includes a second thermal interface material positioned between the top surface of the base portion and at least a portion of the plurality of data center electronic devices.

In another aspect combinable with any one of the previous aspects, the liquid cold plate assembly further includes a plurality of heat transfer surfaces enclosed within the cooling liquid flow path.

Another aspect combinable with any one of the previous aspects further includes a thermal interface material positioned to directly contact a bottom surface of the top portion and a top surface of each of the plurality of data center electronic devices.

In another aspect combinable with any one of the previous aspects, the base portion includes a ring member that circumscribes the volume and is coupled to the top portion.

Another aspect combinable with any one of the previous aspects further includes a seal between the ring member and the top portion.

Another aspect combinable with any one of the previous aspects further includes at least one mechanical fastener that couples the ring member to the top portion.

In another aspect combinable with any one of the previous aspects, the ring member is coupled to a perimeter member of the top portion that is coupled to the heat transfer member and includes a thickness less than a thickness of the heat transfer member.

In another aspect combinable with any one of the previous aspects, the perimeter member is integrally formed with the heat transfer member and at least partially defines the cooling liquid flow path.

Another aspect combinable with any one of the previous aspects further includes a seal positioned between the heat transfer member and the plurality of data center electronic devices.

In another aspect combinable with any one of the previous aspects, the seal includes a metallization layer that at least partially defines the cooling liquid flow path.

In another aspect combinable with any one of the previous aspects, the metallization layer is positioned through a plurality of flow channels formed on a top surface of the heat generating processor device.

In another aspect combinable with any one of the previous aspects, the plurality of flow channels are in fluid communication with the cooling liquid flow path.

Another aspect combinable with any one of the previous aspects further includes a gasket mounted between a bottom surface of the heat transfer member and top surfaces of fins that define the plurality of flow channels formed on the top surface of the heat generating processor device.

In another example implementation, a method for cooling heat generating devices in a data center includes circulating a flow of a cooling liquid to a server tray package that includes a motherboard assembly that includes a plurality of data center electronic devices that include at least one heat generating processor device; and a liquid cold plate assembly that includes a base portion mounted to the motherboard assembly, the base portion and motherboard assembly defining a volume that at least partially encloses the plurality of data center electronic devices, and a top portion mounted to the base portion and including a heat transfer member shaped to thermally contact the heat generating processor device; circulating the flow of the cooling liquid into an inlet port of the heat transfer member; circulating the flow of the cooling liquid from the inlet port through a cooling liquid flow path defined through the heat transfer member to transfer heat from the at least one heat generating processor device; and circulating the heated flow of the cooling liquid from the cooling liquid flow path to an outlet port of the heat transfer member.

In an aspect combinable with the example implementation further includes transferring the heat from the at least one heat generating processor device through a first thermal interface material positioned between the processing device and a top surface of the base portion.

Another aspect combinable with any one of the previous aspects further includes transferring the heat from the top surface of the base portion through a second thermal interface material positioned between the base portion and a bottom surface of the top portion of the liquid cold plate assembly.

In another aspect combinable with any one of the previous aspects, circulating the flow of the cooling liquid through the cooling liquid flow path defined through the heat transfer member includes circulating the cooling liquid through a plurality of flow channels defined by a plurality of heat transfer surfaces enclosed within the cooling liquid flow path.

Another aspect combinable with any one of the previous aspects further includes transferring the heat from the at least one heat generating processor device through a thermal interface material positioned to directly contact a bottom surface of the top portion and a top surface of the at least one heat generating processor device.

Another aspect combinable with any one of the previous aspects further includes circulating the heated flow of the cooling liquid through a portion of the cooling liquid flow path defined by a perimeter member of the top portion is integrally formed with the heat transfer member and at least partially defines the cooling liquid flow path.

Another aspect combinable with any one of the previous aspects further includes circulating the flow of the cooling liquid between a seal positioned between the heat transfer member and the heat generating processing device.

In another aspect combinable with any one of the previous aspects, the seal includes a metallization layer that at least partially defines the cooling liquid flow path.

Another aspect combinable with any one of the previous aspects further includes circulating the flow of cooling liquid through a plurality of flow channels formed on a top surface of the heat generating processor device, at least a portion of each of the plurality of flow channels filled with the metallization layer.

In another example implementation, a method for forming a server tray package includes mounting a plurality of data center electronic devices to a motherboard assembly, the plurality of data center electronic devices including at least one heat generating processor device; mounting a liquid cold plate assembly base to the motherboard assembly to at least partially define a volume that encloses the plurality of data center electronic devices; and mounting a liquid cold plate assembly top hat to the liquid cold plate assembly base, the liquid cold plate assembly top hat including a heat transfer member shaped to thermally contact the heat generating processor device when mounted to the liquid cold plate assembly base, the heat transfer member including an inlet port and an outlet port that are in fluid communication with a cooling liquid flow path defined through the heat transfer member.

In an aspect combinable with the example implementation further includes mounting the plurality of data center electronic devices to an interposer of the motherboard assembly.

Another aspect combinable with any one of the previous aspects further includes mounting the interposer to a substrate of the motherboard assembly.

Another aspect combinable with any one of the previous aspects further includes mounting the substrate to a motherboard of the motherboard assembly.

In another aspect combinable with any one of the previous aspects, mounting the liquid cold plate assembly base to the motherboard assembly includes mounting a stiffener ring member to the substrate with an adhesive.

In another aspect combinable with any one of the previous aspects, mounting the liquid cold plate assembly top hat to the liquid cold plate assembly base includes mounting the liquid cold plate assembly top hat to the stiffener ring member with one or more mechanical fasteners.

Another aspect combinable with any one of the previous aspects further includes inserting a gasket between the liquid cold plate assembly top hat and the stiffener ring member.

Another aspect combinable with any one of the previous aspects further includes applying a liquid sealant between the stiffener ring member and the motherboard assembly.

Another aspect combinable with any one of the previous aspects further includes positioning a first thermal interface material between a lid of the liquid cold plate assembly base and the heat transfer member to form a first heat transfer interface between the lid and the heat transfer member.

Another aspect combinable with any one of the previous aspects further includes positioning a second thermal interface material between the lid and the plurality of data center electronic devices to form a second thermal interface between the lid and the plurality of data center electronic devices.

Another aspect combinable with any one of the previous aspects further includes positioning a thermal interface material between the heat transfer member and the plurality of data center electronic devices to form a heat transfer interface between the heat transfer member and the plurality of data center electronic devices.

Another aspect combinable with any one of the previous aspects further includes applying a metallizing layer between the plurality of data center electronic devices and the heat transfer member.

In another aspect combinable with any one of the previous aspects, the metallizing layer is applied within a plurality of channels formed on a top surface of the at least one heat generating processor device.

Various implementations of a data center cooling system according to the present disclosure may include one, some, or all of the following features. For example, a server tray package according to the present disclosure may provide for direct liquid cooling to high heat generating electronic devices in a data center. As another example, a server tray package according to the present disclosure may provide for multiple functionality including cooling, mechanical rigidity, and liquid coolant sealing. As another example, a server tray package according to the present disclosure may provide for custom cooling liquid flow paths and flow geometries to cool both high and low heat generating electronic devices mounted on a single substrate. As yet another example, the server tray package according to the present disclosure may allow for the cooling of heat-generating devices mounted on a substrate that have different heights (and different power usages).

The details of one or more embodiments are set forth in the accompanying drawings and the description below. Other features, objects, and advantages will be apparent from the description and drawings, and from the claims.

DETAILED DESCRIPTION

In some example implementations, a cooling system, for example, for rack mounted electronic devices (e.g., servers, processors, memory, networking devices or otherwise) in a data center is disclosed. In various disclosed implementations, the cooling system may be or include a liquid cold plate assembly that is part of or integrated with a server tray package. In some implementations, the liquid cold plate assembly includes a base portion and a top portion that, in combination, form a cooling liquid flow path through which a cooling liquid is circulated and a thermal interface between one or more heat generating devices and the cooling liquid.

Figure 1:
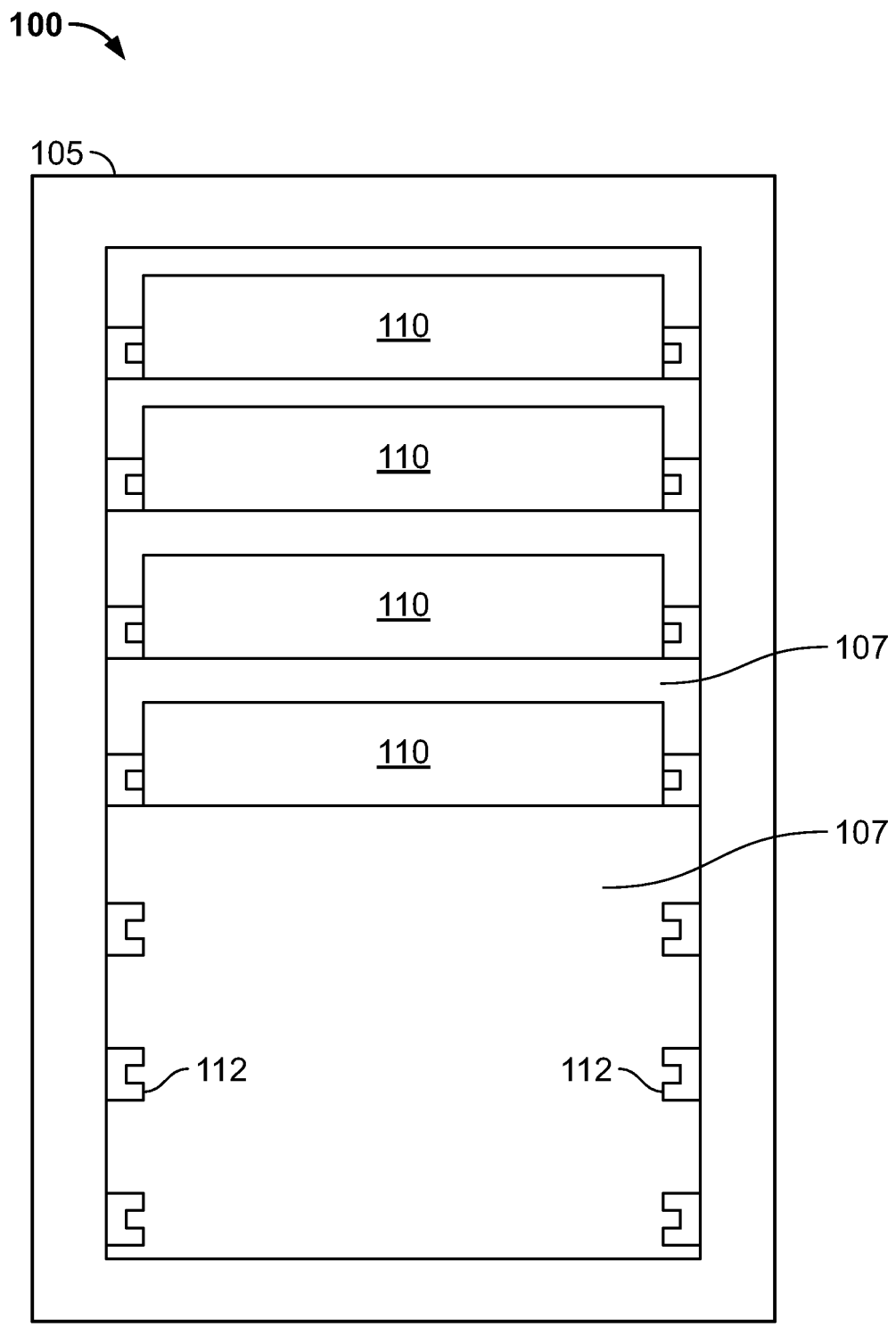
FIG. 1 illustrates a front view of a server rack and server rack sub-assemblies configured to mount within a rack used in a data center environment.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity). Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to the motherboard or other relatively flat structures appurtenant to a motherboard for supporting the motherboard in position in a rack structure. In some implementations, the server rack sub-assembly 110 may be a server tray package, server chassis, or server container (e.g., server box). In some implementations, the server rack sub-assembly 110 may be a hard drive cage.

Figure 2:
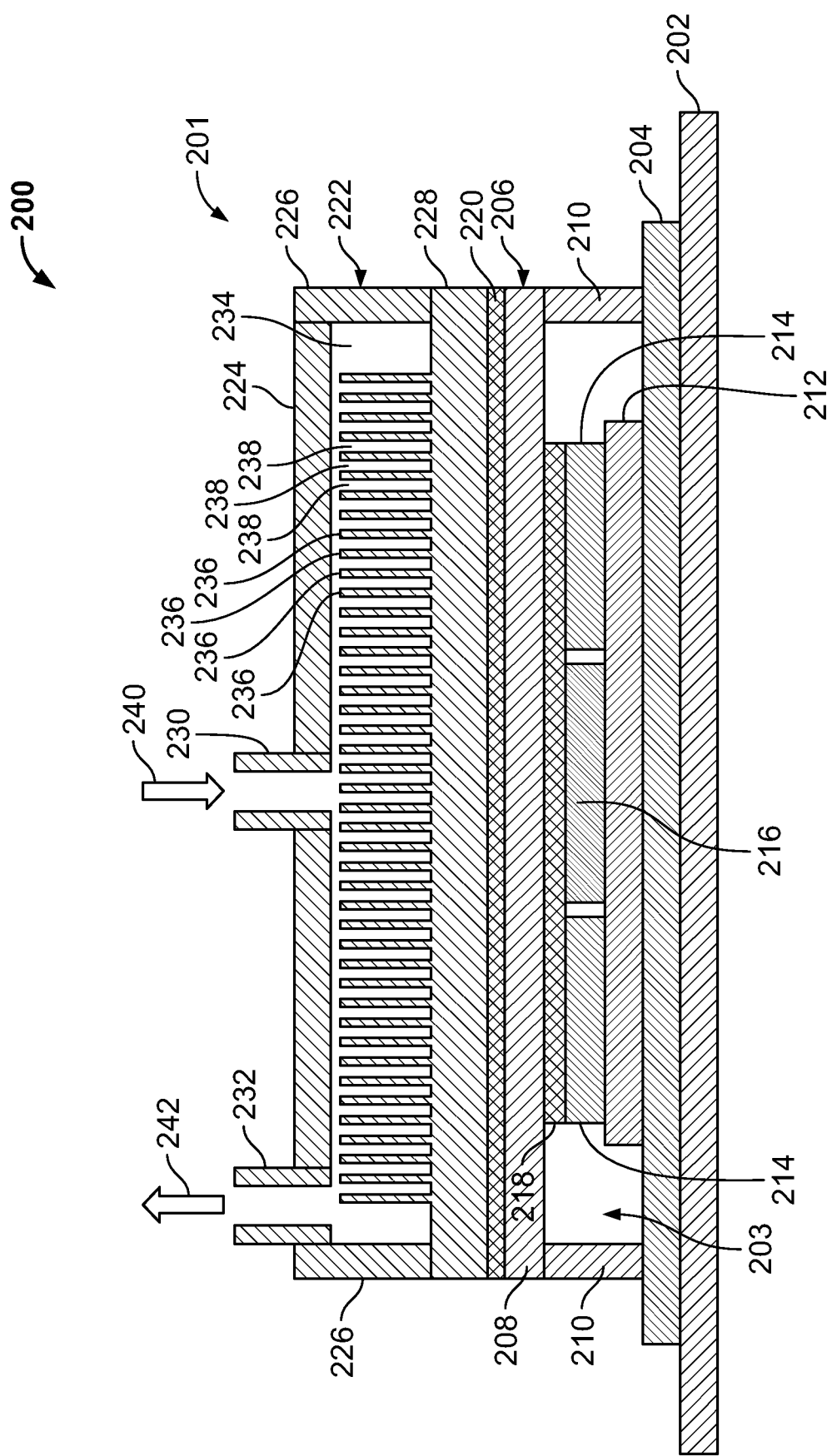
FIG. 2 illustrates a schematic side view of an example implementation of a server tray package that includes a liquid cold plate assembly.

FIG. 2 illustrates a schematic side view of an example implementation of a server tray package 200 that includes a liquid cold plate assembly 201. In some implementations, the server tray package 200 may be used as one or more of the server rack sub-assemblies 110 shown in FIG. 1. Referring to FIG. 2, the server tray package 200 includes a printed circuit board 202, e.g., motherboard 202, that supports one or more data center electronic devices; in this example, two or more memory modules 214 and one or more processing devices 216 (e.g., one or more application-specific integrated circuits (ASIC)). In some aspects, the motherboard 202 may be mounted on a frame (not shown), which can include or simply be a flat structure that can be grasped by technicians for moving the motherboard 202 into place and holding it in position within the rack 105. For example, the server tray package 200 may be mounted horizontally in the server rack 105 such as by sliding the frame into the slot 107 and over a pair of rails in the rack 105 on opposed sides of the server tray package 200—much like sliding a lunch tray into a cafeteria rack. The frame can extend below the motherboard 202 or can have other forms (e.g., by implementing it as a peripheral frame around the motherboard 202) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 202 is mounted on a frame; alternatively, multiple motherboards 202 may be mounted on a frame, depending on the needs of the particular application. In some implementations, the one or more fans (not shown) can be placed on the motherboard 202 or a frame so that air enters at the front edge of the server tray package 200, closer to the front of the rack 105 when the server tray package 200 is installed in the rack 105, flows over the motherboard 202, over some of the data center electronic components on the motherboard 202, and is exhausted from the server tray package 200 at the back edge, closer to the back of the rack 105 when the server tray package 200 is installed in the rack 105. The one or more fans can be secured to the motherboard 202 or a frame by brackets.

As illustrated, a substrate 204 and an interposer 212 (e.g., a silicon interposer) are positioned between the data center electronic devices 214 and 216 and the motherboard 202. The substrate 204, for example, provides an interface between one or more of the data center electronic devices (e.g., the processing device 216) and the motherboard 202, such as through pins that provide electrical and communication interfaces. The substrate 204 also, in this example, may provide a mounting location for one or more components of the liquid cold plate assembly 201. The interposer 212, for example, provides a high bandwidth connection between the data center electronic devices, such as between the memory modules 214 and the processing device 216.

As shown in FIG. 2, the liquid cold plate assembly 201 includes a top portion 222, also referred to as a top hat 222, and a base portion 206. The base portion 206 includes a lid 208 that defines a top surface of the base portion 206 and sides 216 that couple the lid 208 to the substrate 204. In combination, the lid 208 and the sides 210 define or enclose a volume 203 in which the interposer 212 and the data center electronic devices 214 and 216 (mounted thereon) are positioned in the server tray package 200. As shown in this example, a thermal interface material 218 (e.g., a phase change material or otherwise thermally conductive material) is contactingly positioned between a bottom side of the lid 208 and the data center electronic devices 214 and 216 to provide a conductive heat transfer interface between these components.

In this example implementation, the top hat 222 is mounted to a top surface of the lid 208 through another thermal interface material 220 (e.g., a phase change material or otherwise thermally conductive material) that provides a conductive heat transfer interface between a bottom 228 of the top hat 222 and the lid 208 of the base portion 206. The top hat 222, as shown, includes a cap 224 that is connected to the bottom 228 through sides 226. In combination, the cap 224, sides 226, and bottom 228 define a volume 234 through which a flow of a cooling liquid may be circulated.

As shown in this example, the cap 224 includes a cooling liquid inlet 230 through which a supply 240 of cooling liquid may enter. The cap 224 also includes a cooling liquid outlet 232 through which a return 242 of cooling liquid may exit. The volume 234 defines or includes a cooling liquid flow path between the inlet 230 and the outlet 232. As shown in this example, one or more heat transfer surfaces 236 (e.g., fins, undulations, ridges, or other extended surfaces that increase a heat transfer area) are positioned in the volume 234. The heat transfer surfaces 236 define channels 238, for example, through which the cooling liquid may be circulated to increase an amount of heat transferred from the data center electronic devices 214 and 216 to the cooling liquid (e.g., relative to an amount transferred in an implementation of the server tray package 200 that does not include the heat transfer surfaces 236). Alternative implementations of the server tray package 200 may include multiple inlets 230, multiple outlets 232, or may not include the heat transfer surfaces 236.

In an example operation of the server tray package 200 to cool the data center electronic devices 214 and 216, the server tray package 200 may be deployed, for example, in a data center server rack 105 in a data center. During operation of the server tray package 200, the processing device 216 and memory modules 214 generate heat that may need to be dissipated or removed from the server tray package 200 (e.g., for proper operation of the server tray package 200). Heat generated by the processing device 216 and memory modules 214 is transferred through the thermal interface material 218 and to the lid 208 of the base portion 206 of the liquid cold plate assembly 201. The transferred heat is further transferred from the lid 208, through the thermal interface material 220, and to the bottom 228 of the top hat 222. In some examples, one or more components of the liquid cold plate assembly 201 may be formed or made from a thermally conductive material, such as copper, aluminum, a combination of copper and aluminum, or other thermally conductive materials.

The heat transferred to the bottom 228 of the top hat 222 is then transferred to the supply 240 of the cooling liquid that is circulated through the inlet 230 and into the volume 234 of the top hat 222. In some examples, the cooling liquid may be a chilled water or glycol, such as from one or more chillers fluidly coupled to the server tray package 200. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 240 may be at an appropriate temperature and flow rate to remove a desired amount of heat from the data center electronic devices 214 and 216.

In some examples, heat is transferred directly from the bottom 228 to the cooling liquid supply 240. Heat may also be transferred from the bottom 228, through one or more heat transfer surfaces 236, and then to the cooling liquid supply 240 that flows through channels 238. The heated cooling liquid supply 240 is circulated to the outlet 232 and exits the top hat 222 as the cooling liquid return 242 (e.g., that is at a higher temperature than the cooling liquid supply 240). The cooling liquid return 242 is circulated back, e.g., to a source of the cooling liquid, to expel the heat (e.g., in a chiller, cooling tower, or other heat exchanger) from the return 242.

In an example operation for making the server tray package 200, the interposer 212, substrate 204, and motherboard 202 may be mounted together to form an assembly to which the data center electronic devices 214 and 216 may be mounted and connected (e.g., for power and communication). The thermal interface material 218 is then mounted or positioned on top of the data center electronic devices 214 and 216.

Next, the base portion 206 is mounted on the substrate 204 (in this example) to enclose the interposer 212 and data center electronic devices 214 and 216 within the volume 203. In some examples, the sides 210 are first mounted to the substrate 204 and the lid 208 is then mounted to the sides 210 to contact the thermal interface material 218. In some examples, mechanical fasteners or adhesive may be used to connect the base portion 206 to the substrate 204.

Next, the thermal interface material 220 is mounted to the top surface of the lid 208 of the base portion 206. The top hat 222 is then mounted onto the base portion 206 (with the thermal interface material 220 in between) so that the bottom 228 is on top of the lid 208. In some aspects, mechanical fasteners or an adhesive may be used to connect the top hat 222 to the base portion 206. Further, in some aspects, the top hat 222 may be mounted to the base portion 206 on a component-by-component basis. For example, the bottom 228 may first be mounted to the lid 208 of the base portion 206. Next, the sides 226 may be mounted to the bottom 228. Next, the cap 224 may be mounted to the sides 226.

Figure 3:
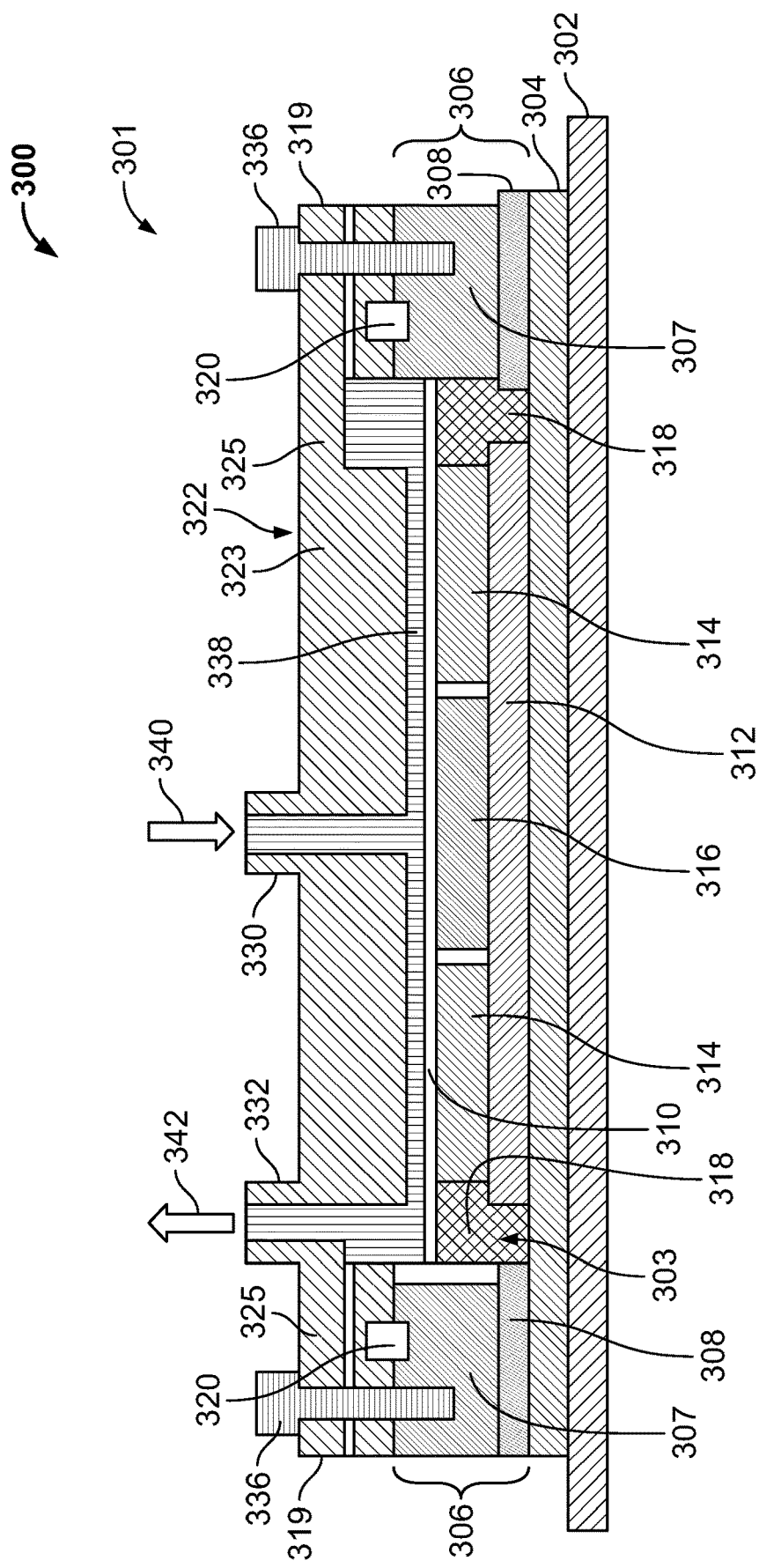
FIG. 3 illustrates a schematic side view of another example implementation of a server tray package that includes a liquid cold plate assembly.

FIG. 3 illustrates a schematic side view of another example implementation of a server tray package 300 that includes a liquid cold plate assembly 301. In some implementations, the server tray package 300 may be used as one or more of the server rack sub-assemblies 110 shown in FIG. 1. Referring to FIG. 3, the server tray package 300 includes a printed circuit board 302, e.g., motherboard 302, that supports one or more data center electronic devices; in this example, two or more memory modules 314 and one or more processing devices 316 (e.g., one or more application-specific integrated circuits (ASIC)). In some aspects, the motherboard 302 may be mounted on a frame (not shown), which can include or simply be a flat structure that can be grasped by technicians for moving the motherboard 302 into place and holding it in position within the rack 105. For example, the server tray package 300 may be mounted horizontally in the server rack 105 such as by sliding the frame into the slot 107 and over a pair of rails in the rack 105 on opposed sides of the server tray package 300—much like sliding a lunch tray into a cafeteria rack. The frame can extend below the motherboard 302 or can have other forms (e.g., by implementing it as a peripheral frame around the motherboard 302) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 302 is mounted on a frame; alternatively, multiple motherboards 302 may be mounted on a frame, depending on the needs of the particular application. In some implementations, the one or more fans (not shown) can be placed on the motherboard 302 or a frame so that air enters at the front edge of the server tray package 300, closer to the front of the rack 105 when the server tray package 300 is installed in the rack 105, flows over the motherboard 302, over some of the data center electronic components on the motherboard 302, and is exhausted from the server tray package 300 at the back edge, closer to the back of the rack 105 when the server tray package 300 is installed in the rack 105. The one or more fans can be secured to the motherboard 302 or a frame by brackets.

As illustrated, a substrate 304 and an interposer 312 (e.g., a silicon interposer) are positioned between the data center electronic devices 314 and 316 and the motherboard 302. The substrate 304, for example, provides an interface between one or more of the data center electronic devices (e.g., the processing device 316) and the motherboard 302, such as through pins that provide electrical and communication interfaces. The substrate 304 also, in this example, may provide a mounting location for one or more components of the liquid cold plate assembly 301. The interposer 312, for example, provides a high bandwidth connection between the data center electronic devices, such as between the memory modules 314 and the processing device 316.

As shown in FIG. 3, the liquid cold plate assembly 301 includes a top portion 322, also referred to as a top hat 322, and a base portion 306. The base portion 306, in this example, includes a stiffener ring 307 that is mounted and sealingly coupled to the substrate 304 with a sealant layer 308. In combination, the stiffener ring 307 and the sealant layer 308 at least partially define or enclose a volume 303 in which the interposer 312 and the data center electronic devices 314 and 316 (mounted thereon) are positioned in the server tray package 300. As shown in this example, an epoxy ring 318 fills in the volume 303 to form a fluid seal between the data center electronic devices 314 and 316 and the stiffener ring 307. The stiffener ring 307, in some aspects, may provide a rigid structure that, for instance, provides mechanical stiffness for the server tray package 300.

In this example, a thermal interface material 310 (e.g., a metallizing layer or otherwise thermally conductive material) is contactingly positioned on a top side of the data center electronic devices 314 and 316 and the epoxy ring 318. The thermal interface material 310, as a metallizing layer, may be comprised of nickel, gold, stainless steel, or other thermally conductive material, and provides a conductive heat transfer interface between these components and the top hat 322. The thermal interface material 310 also provides, in this example, a fluid seal between the data center electronic devices 314 and 316, and the volume 303, generally, and a cooling liquid supplied to the top hot 322.

In this example implementation, the top hat 322 is mounted to the thermal interface material 320 and a top surface of the stiffener ring 307. As shown in this example, a gasket 320 is positioned in grooves formed in the stiffener ring 307 and the top hat 322 and, once secured together with one or more mechanical fasteners 336, there is a fluid seal between the top hat 322 and the base portion 306 of the liquid cold plate assembly 301.

Further, once secured together, a fluid channel 338 is defined by the top hat 322, the thermal interface material 310, and the stiffener ring 307. The fluid channel 338 extends laterally from a middle centerline of the top hat 322 (coincident with a cooling liquid inlet 330) toward the stiffener ring 307 and under a middle portion 323 of the top hot 322. As shown, as the fluid channel 338 reaches a portion of its volume that is vertically above the epoxy ring 318 (separated by the thermal interface material 310), a height of the fluid channel 338 increases as the middle portion 323 transitions to a perimeter portion 325 of the top hat 322 that is thinner (as shown in this perspective) than the middle portion 323.

As shown in this example, the top hat 322 includes the cooling liquid inlet 330 through which a supply 340 of cooling liquid may enter. The top hat 322 also includes a cooling liquid outlet 332 through which a return 342 of cooling liquid may exit, after passing through the cooling liquid flow path 338. In some aspects, one or more heat transfer surfaces, such as fins, undulations, ridges, or other extended surfaces that increase a heat transfer area, may be positioned in the cooling liquid flow path 338. Alternative implementations of the server tray package 300 may include multiple inlets 330 and/or multiple outlets 332.

In an example operation of the server tray package 300 to cool the data center electronic devices 314 and 316, the server tray package 300 may be deployed, for example, in a data center server rack 105 in a data center. During operation of the server tray package 300, the processing device 316 and memory modules 314 generate heat that may need to be dissipated or removed from the server tray package 300 (e.g., for proper operation of the server tray package 300).

Heat generated by the processing device 316 and memory modules 314 is transferred through the thermal interface material 310.

The heat transferred to the thermal interface material 310 is then transferred to the supply 340 of the cooling liquid that is circulated through the inlet 330 and into the cooling liquid flow path 338 of the top hat 322. In some examples, the cooling liquid may be a chilled water or glycol, such as from one or more chillers fluidly coupled to the server tray package 300. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 340 may be at an appropriate temperature and flow rate to remove a desired amount of heat from the data center electronic devices 314 and 316.

The heated cooling liquid supply 340 is circulated to the outlet 332 and exits the top hat 322 as the cooling liquid return 342 (e.g., that is at a higher temperature than the cooling liquid supply 340). The cooling liquid return 342 is circulated back, e.g., to a source of the cooling liquid, to expel the heat (e.g., in a chiller, cooling tower, or other heat exchanger) from the return 342.

In an example operation for making the server tray package 300, the interposer 312, substrate 304, and motherboard 302 may be mounted together to form an assembly to which the data center electronic devices 314 and 316 may be mounted and connected (e.g., for power and communication). The stiffener ring 307 of the base portion 306 may be secured to the substrate 304 with the sealant layer 308 to at least partially define the volume 303. The epoxy ring 318 may then be positioned or circulated to fill in the volume 303 between the stiffener ring 307 and the data center electronic devices. The thermal interface material 310 may then be mounted or positioned on top of the data center electronic devices 314 and 316.

Next, the gasket 320 may be fitted within a groove formed on a top surface of the stiffener ring 307. The top hat 322 is then mounted onto the base portion 306 (onto the stiffener ring 307) and the thermal interface material 310 so that the gasket 320 fits into a groove formed in a bottom surface of the perimeter portion 325 of the top hot 322. As shown, one or more mechanical fasteners 336 are used to connect the top hat 322 to the stiffener ring 307.

Figure 4:
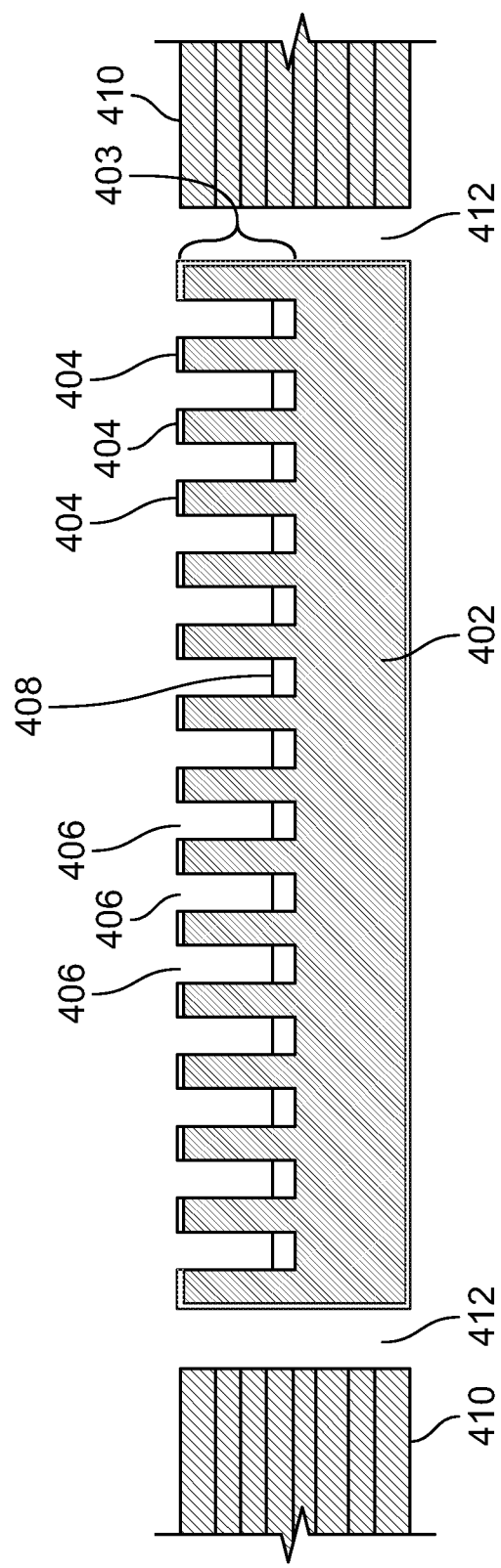
FIG. 4 illustrates a schematic side view of a portion of an example implementation of a server tray package that includes a liquid cold plate assembly.

FIG. 4 illustrates a schematic side view of a portion of an example implementation of a server tray package that includes a liquid cold plate assembly. More specifically, FIG. 4 shows a processing device 402 that is positioned between memory modules 410 (separated by air gaps or heat transfer material 412). The processing device 402 may be used, for example, in the server tray package 300 (or other server tray packages according to the present disclosure). For example, as shown, the processing device 402 includes grooves 406 formed in a top portion 403 of the processing device package. The grooves 406 are formed or defined by heat transfer surfaces 404 (e.g., fins, ridges, or otherwise) formed in the top portion 403 of the processing device package.

As shown, a thermal interface material 408, such as a metallizing layer, is positioned or spread within the grooves 406. As shown, in some aspects, the material 408 may only fill a portion of each of the grooves 406 (e.g., not up to a height of the heat transfer surfaces 404). The thermal interface material 408, as a metallizing layer, may be comprised of nickel, gold, stainless steel, or other thermally conductive materials, and provides a conductive heat transfer interface between these components and, for example, a portion of a liquid cold plate assembly. The thermal interface material 408 also provides, in this example, a fluid seal between the processing device 402 and a cooling liquid supplied to a liquid cold plate assembly.

In an alternative aspect, the top portion 403 of the processing device 402 may be separate from the device 402, itself. For example, a housing of the processing device 402 may be substantially planar on a top surface, and the top portion 403 (which includes the heat transfer surfaces 406 and grooves 408) may be coupled (e.g., attached by an indium thermal interface material) to the processing device 402. Thus, the housing of the processing device 402 may stay relatively identical across a multitude of the devices 402.

Figure 5:
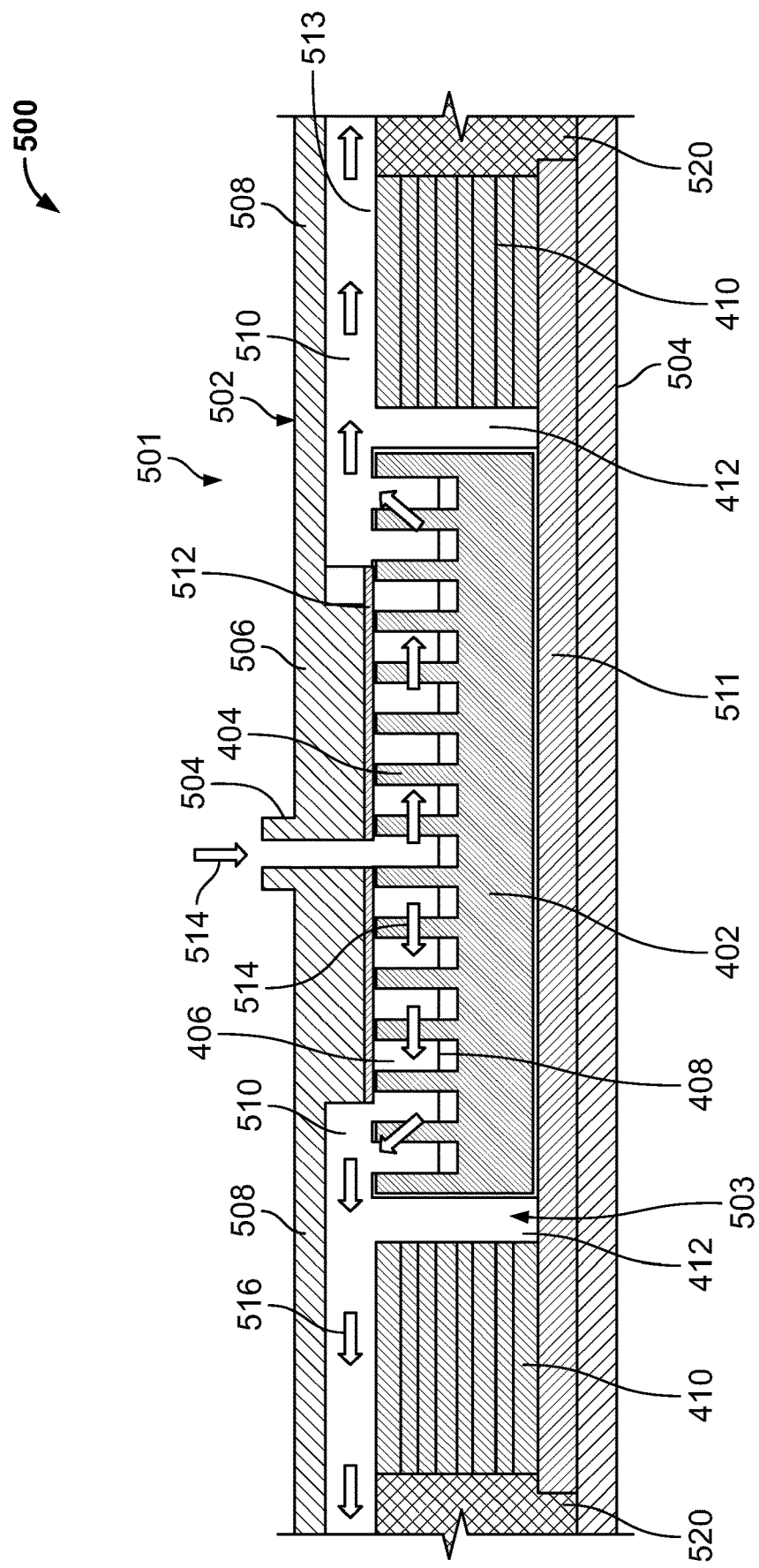
FIG. 5 illustrates a schematic side view of a portion of an example implementation of a server tray package that includes a liquid cold plate assembly.

FIG. 5 illustrates a schematic side view of a portion of an example implementation of a server tray package 500 that includes a liquid cold plate assembly 501. In the illustrated example, the processing device 402 is used in the server tray package 500 in combination, for example, with at least portions of a liquid cold plate assembly similar to liquid cold plate assembly 301 shown in FIG. 3. For example, as shown, the processing device 402 and memory modules 410 are mounted to an interposer 511 (e.g., a silicon interposer) that is in turn, mounted to a substrate 504 (which is mounted to a motherboard, not shown). An epoxy ring 520 surrounds the memory modules 410 and provides a fluid seal between a volume 503 and a base portion of the liquid cold plate assembly 501 (not shown in this example, but similar, for instance, to base portion 306).

As shown in this example, a top hat 502 is mounted at least partially to the processing device 401, such as to top surfaces of the heat transfer surfaces 404. As shown, a seal 512 (e.g., a gasket or otherwise) is positioned between a bottom surface of the top hat 502 and the heat transfer surfaces 404 in order to, e.g., fluidly seal some channels 406 from other channels 406 at tops of the channels 406. Further, as shown, a heat transfer material 513 (e.g., a metallizing layer) is also positioned or mounted on tops of the memory modules 410 and epoxy ring 520 to fluidly seal these components from a liquid flow through flow path 510.

In this example, the top hat 502 includes a middle portion 506 and a perimeter portion 508 that is thinner (as shown in this perspective) than the middle portion 506. A flow path 510 is shown in this example, and includes the channels 406 and extends laterally from a cooling liquid inlet 504 that, in this example, is centered in the top hat 502.

In an example operation of the server tray package 500 to cool the processing device 402 and the memory modules 410, the server tray package 500 may be deployed, for example, in a data center server rack 105 in a data center. During operation of the server tray package 500, the processing device 402 and memory modules 410 generate heat that may need to be dissipated or removed from the server tray package 500 (e.g., for proper operation of the server tray package 500).

Heat generated by the processing device 402 is transferred to the thermal interface material 408. The heat transferred to the thermal interface material 408 is then transferred to the supply 514 of the cooling liquid that is circulated through the inlet 504 and into the cooling liquid flow path 510 (including channels 406) of the top hat 502. In some examples, the cooling liquid may be a chilled water or glycol, such as from one or more chillers fluidly coupled to the server tray package 500. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 514 may be at an appropriate temperature and flow rate to remove a desired amount of heat from the processing device 402 and memory modules 410.

The heated cooling liquid supply 514 is circulated to an outlet of the top hat 502 (not shown) and exits the top hat 502 as a cooling liquid return (e.g., that is at a higher temperature than the cooling liquid supply 514). The cooling liquid return is circulated back, e.g., to a source of the cooling liquid, to expel the heat (e.g., in a chiller, cooling tower, or other heat exchanger) from the return.

Figure 6:
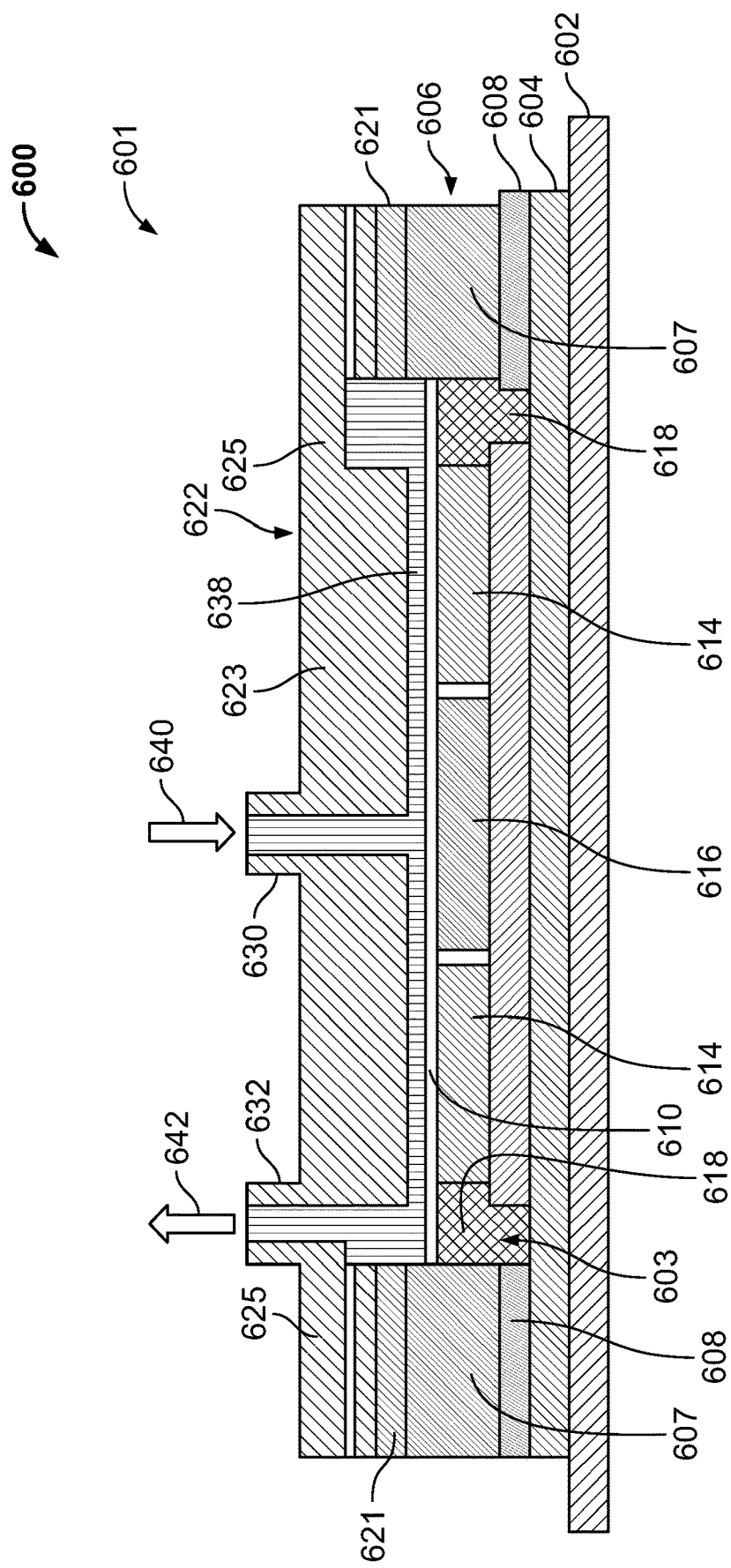
FIG. 6 illustrates a schematic side view of another example implementation of a server tray package that includes a liquid cold plate assembly.

FIG. 6 illustrates a schematic side view of another example implementation of a server tray package 600 that includes a liquid cold plate assembly 601. In some implementations, the server tray package 600 may be used as one or more of the server rack sub-assemblies 110 shown in FIG. 1. Referring to FIG. 6, the server tray package 600 includes a printed circuit board 602, e.g., motherboard 602, that supports one or more data center electronic devices; in this example, two or more memory modules 614 and one or more processing devices 616 (e.g., one or more application-specific integrated circuits (ASIC)). In some aspects, the motherboard 602 may be mounted on a frame (not shown), which can include or simply be a flat structure that can be grasped by technicians for moving the motherboard 602 into place and holding it in position within the rack 105. For example, the server tray package 600 may be mounted horizontally in the server rack 105 such as by sliding the frame into the slot 107 and over a pair of rails in the rack 105 on opposed sides of the server tray package 600—much like sliding a lunch tray into a cafeteria rack. The frame can extend below the motherboard 602 or can have other forms (e.g., by implementing it as a peripheral frame around the motherboard 602) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 602 is mounted on a frame; alternatively, multiple motherboards 602 may be mounted on a frame, depending on the needs of the particular application. In some implementations, the one or more fans (not shown) can be placed on the motherboard 602 or a frame so that air enters at the front edge of the server tray package 600, closer to the front of the rack 105 when the server tray package 600 is installed in the rack 105, flows over the motherboard 602, over some of the data center electronic components on the motherboard 602, and is exhausted from the server tray package 600 at the back edge, closer to the back of the rack 105 when the server tray package 600 is installed in the rack 105. The one or more fans can be secured to the motherboard 602 or a frame by brackets.

As illustrated, a substrate 604 and an interposer 612 (e.g., a silicon interposer) are positioned between the data center electronic devices 614 and 616 and the motherboard 602. The substrate 604, for example, provides an interface between one or more of the data center electronic devices (e.g., the processing device 616) and the motherboard 602, such as through pins that provide electrical and communication interfaces. The substrate 604 also, in this example, may provide a mounting location for one or more components of the liquid cold plate assembly 601. The interposer 612, for example, provides a high bandwidth connection between the data center electronic devices, such as between the memory modules 614 and the processing device 616.

As shown in FIG. 6, the liquid cold plate assembly 601 includes a top portion 622, also referred to as a top hat 622, and a base portion 606. The base portion 606, in this example, includes a stiffener ring 607 that is mounted and sealingly coupled to the substrate 604 with a sealant layer 608. In combination, the stiffener ring 607 and the sealant layer 608 at least partially define or enclose a volume 603 in which the interposer 612 and the data center electronic devices 614 and 616 (mounted thereon) are positioned in the server tray package 600. As shown in this example, an epoxy ring 618 fills in the volume 603 to form a fluid seal between the data center electronic devices 614 and 616 and the stiffener ring 607. The stiffener ring 607, in some aspects, may provide a rigid structure that, for instance, provides mechanical stiffness for the server tray package 600.

In this example, a thermal interface material 610 (e.g., a metallizing layer or otherwise thermally conductive material) is contactingly positioned on a top side of the data center electronic devices 614 and 616 and the epoxy ring 618. The thermal interface material 610, as a metallizing layer, may be comprised of nickel, gold, stainless steel, or other thermally conductive material, and provides a conductive heat transfer interface between these components and the top hat 622. The thermal interface material 610 also provides, in this example, a fluid seal between the data center electronic devices 614 and 616, and the volume 603, generally, and a cooling liquid supplied to the top hot 622.

In this example implementation, the top hat 622 is mounted to the thermal interface material 620 and a top surface of the stiffener ring 607. As shown in this example, an adhesive 621 (e.g., a metallurgical and/or epoxy sealant) is formed or positioned on top of the stiffener ring 607. The top hat 623 is connected to the base portion 606 (and the stiffener ring 607) with the adhesive 619.

Further, once secured together, a fluid channel 638 is defined by the top hat 622, the thermal interface material 610, and the stiffener ring 607. The fluid channel 638 extends laterally from a middle centerline of the top hat 622 (coincident with a cooling liquid inlet 630) toward the stiffener ring 607 and under a middle portion 623 of the top hot 622. As shown, as the fluid channel 638 reaches a portion of its volume that is vertically above the epoxy ring 618 (separated by the thermal interface material 610), a height of the fluid channel 638 increases as the middle portion 623 transitions to a perimeter portion 625 of the top hat 622 that is thinner (as shown in this perspective) than the middle portion 623.

As shown in this example, the top hat 622 includes the cooling liquid inlet 630 through which a supply 640 of cooling liquid may enter. The top hat 622 also includes a cooling liquid outlet 632 through which a return 642 of cooling liquid may exit, after passing through the cooling liquid flow path 638. In some aspects, one or more heat transfer surfaces, such as fins, undulations, ridges, or other extended surfaces that increase a heat transfer area, may be positioned in the cooling liquid flow path 638. Alternative implementations of the server tray package 600 may include multiple inlets 630 and/or multiple outlets 632.

In an example operation of the server tray package 600 to cool the data center electronic devices 614 and 616, the server tray package 600 may be deployed, for example, in a data center server rack 105 in a data center. During operation of the server tray package 600, the processing device 616 and memory modules 614 generate heat that may need to be dissipated or removed from the server tray package 600

(e.g., for proper operation of the server tray package 600). Heat generated by the processing device 616 and memory modules 614 is transferred through the thermal interface material 610.

The heat transferred to the thermal interface material 610 is then transferred to the supply 640 of the cooling liquid that is circulated through the inlet 630 and into the cooling liquid flow path 638 of the top hat 622. In some examples, the cooling liquid may be a chilled water or glycol, such as from one or more chillers fluidly coupled to the server tray package 600. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 640 may be at an appropriate temperature and flow rate to remove a desired amount of heat from the data center electronic devices 614 and 616.

The heated cooling liquid supply 640 is circulated to the outlet 632 and exits the top hat 622 as the cooling liquid return 642 (e.g., that is at a higher temperature than the cooling liquid supply 640). The cooling liquid return 642 is circulated back, e.g., to a source of the cooling liquid, to expel the heat (e.g., in a chiller, cooling tower, or other heat exchanger) from the return 642.

In an example operation for making the server tray package 600, the interposer 612, substrate 604, and motherboard 602 may be mounted together to form an assembly to which the data center electronic devices 614 and 616 may be mounted and connected (e.g., for power and communication). The stiffener ring 607 of the base portion 606 may be secured to the substrate 604 with the sealant layer 608 to at least partially define the volume 603. The epoxy ring 618 may then be positioned or circulated to fill in the volume 603 between the stiffener ring 607 and the data center electronic devices. The thermal interface material 610 may then be mounted or positioned on top of the data center electronic devices 614 and 616.

Next, the adhesive 621 is mounted or formed on the stiffener ring 607 as shown. The top hat 622 is then mounted onto the base portion 606 (onto the stiffener ring 607) and attached with the adhesive 621.

Figure 7:
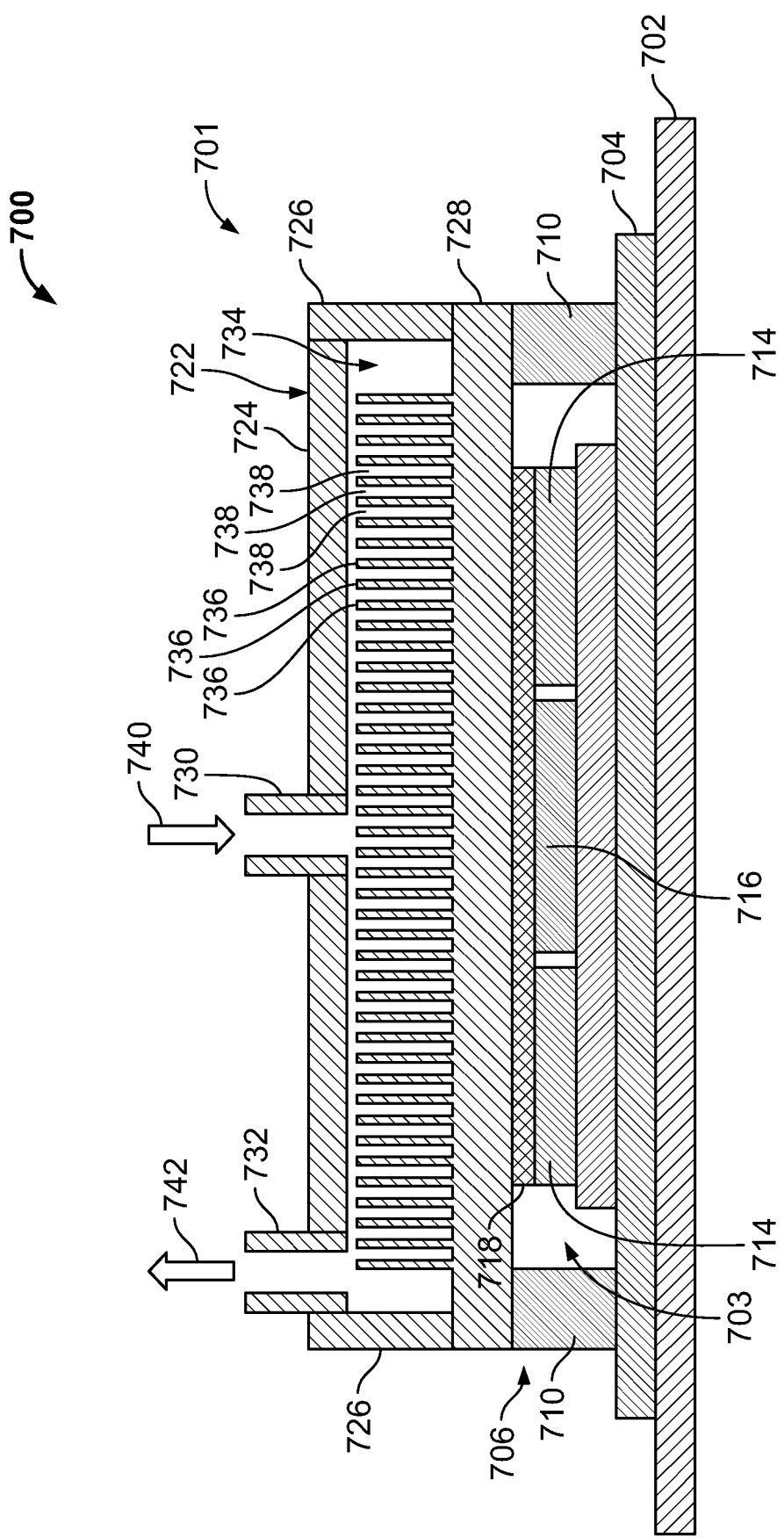
FIG. 7 illustrates a schematic side view of an example implementation of a server tray package that includes a liquid cold plate assembly.

FIG. 7 illustrates a schematic side view of an example implementation of a server tray package 700 that includes a liquid cold plate assembly 701. In some implementations, the server tray package 700 may be used as one or more of the server rack sub-assemblies 110 shown in FIG. 1. Referring to FIG. 7, the server tray package 700 includes a printed circuit board 702, e.g., motherboard 702, that supports one or more data center electronic devices; in this example, two or more memory modules 714 and one or more processing devices 716 (e.g., one or more application-specific integrated circuits (ASIC)). In some aspects, the motherboard 702 may be mounted on a frame (not shown), which can include or simply be a flat structure that can be grasped by technicians for moving the motherboard 702 into place and holding it in position within the rack 105. For example, the server tray package 700 may be mounted horizontally in the server rack 105 such as by sliding the frame into the slot 107 and over a pair of rails in the rack 105 on opposed sides of the server tray package 700—much like sliding a lunch tray into a cafeteria rack. The frame can extend below the motherboard 702 or can have other forms (e.g., by implementing it as a peripheral frame around the motherboard 702) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 702 is mounted on a frame; alternatively, multiple motherboards 702 may be mounted on a frame, depending on the needs of the particular application. In some implementations, the one or more fans (not shown) can be placed on the motherboard 702 or a frame so that air enters at the front edge of the server tray package 700, closer to the front of the rack 105 when the server tray package 700 is installed in the rack 105, flows over the motherboard 702, over some of the data center electronic components on the motherboard 702, and is exhausted from the server tray package 700 at the back edge, closer to the back of the rack 105 when the server tray package 700 is installed in the rack 105. The one or more fans can be secured to the motherboard 702 or a frame by brackets.

As illustrated, a substrate 704 and an interposer 712 (e.g., a silicon interposer) are positioned between the data center electronic devices 714 and 716 and the motherboard 702. The substrate 704, for example, provides an interface between one or more of the data center electronic devices (e.g., the processing device 716) and the motherboard 702, such as through pins that provide electrical and communication interfaces. The substrate 704 also, in this example, may provide a mounting location for one or more components of the liquid cold plate assembly 701. The interposer 712, for example, provides a high bandwidth connection between the data center electronic devices, such as between the memory modules 714 and the processing device 716.

As shown in FIG. 7, the liquid cold plate assembly 701 includes a top portion 722, also referred to as a top hat 722, and a base portion 706. The base portion 706 includes a stiffener ring 710 that defines sides of the base portion 706 and is coupled (e.g., mechanically or adhesively) to the substrate 704. The stiffener ring 710 at least partially defines a volume 703 in which the interposer 712 and the data center electronic devices 714 and 716 (mounted thereon) are positioned in the server tray package 700. As shown in this example, a thermal interface material 718 (e.g., a phase change material or otherwise thermally conductive material) is contactingly positioned on top of the data center electronic devices 714 and 716 to provide a conductive heat transfer interface between these components and the top hot 722. The stiffener ring 710, in some aspects, may provide a rigid structure that, for instance, provides mechanical stiffness for the server tray package 700.

In this example implementation, the top hat 722 is mounted to a top surface of the stiffener ring 710 (e.g., mechanically or adhesively) and to the thermal interface material 718 that provides a conductive heat transfer interface between a bottom 728 of the top hat 722 and the data center electronic devices 714 and 716. The top hat 722, as shown, includes a cap 724 that is connected to the bottom 728 (which, in this example, also serves as a lid to the base portion 706) through sides 726. In combination, the cap 724, sides 726, and bottom 728 define a volume 734 through which a flow of a cooling liquid may be circulated.

As shown in this example, the cap 724 includes a cooling liquid inlet 730 through which a supply 740 of cooling liquid may enter. The cap 724 also includes a cooling liquid outlet 732 through which a return 742 of cooling liquid may exit. The volume 734 defines or includes a cooling liquid flow path between the inlet 730 and the outlet 732. As shown in this example, one or more heat transfer surfaces 736 (e.g., fins, undulations, ridges, or other extended surface that increases a heat transfer area) are positioned in the volume 734. The heat transfer surfaces 736 define channels 738, for example, through which the cooling liquid may be circulated to increase an amount of heat transferred from the data center electronic devices 714 and 716 to the cooling liquid (e.g., relative to an amount transferred in an implementation of the server tray package 700 that does not include the heat transfer surfaces 736). Alternative implementations of the server tray package 700 may include multiple inlets 730, multiple outlets 732, or may not include the heat transfer surfaces 736.

In an example operation of the server tray package 700 to cool the data center electronic devices 714 and 716, the server tray package 700 may be deployed, for example, in a data center server rack 105 in a data center. During operation of the server tray package 700, the processing device 716 and memory modules 714 generate heat that may need to be dissipated or removed from the server tray package 700 (e.g., for proper operation of the server tray package 700). Heat generated by the processing device 716 and memory modules 714 is transferred through the thermal interface material 718 and to the bottom 728 of the top hat 722. In some examples, one or more components of the liquid cold plate assembly 701 may be formed or made from a thermally conductive material, such as copper, aluminum, a combination of copper and aluminum, or other thermally conductive materials.

The heat transferred to the bottom 728 of the top hat 722 is then transferred to the supply 740 of the cooling liquid that is circulated through the inlet 730 and into the volume 734 of the top hat 722. In some examples, the cooling liquid may be a chilled water or glycol, such as from one or more chillers fluidly coupled to the server tray package 700. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 740 may be at an appropriate temperature and flow rate to remove a desired amount of heat from the data center electronic devices 714 and 716.

In some examples, heat is transferred directly from the bottom 728 to the cooling liquid supply 740. Heat may also be transferred from the bottom 728, through one or more heat transfer surfaces 736, and then to the cooling liquid supply 740 that flows through channels 738. The heated cooling liquid supply 740 is circulated to the outlet 732 and exits the top hat 722 as the cooling liquid return 742 (e.g., that is at a higher temperature than the cooling liquid supply 740). The cooling liquid return 742 is circulated back, e.g., to a source of the cooling liquid, to expel the heat (e.g., in a chiller, cooling tower, or other heat exchanger) from the return 742.

In an example operation for making the server tray package 700, the interposer 712, substrate 704, and motherboard 702 may be mounted together to form an assembly to which the data center electronic devices 714 and 716 may be mounted and connected (e.g., for power and communication). The thermal interface material 718 is then mounted or positioned on top of the data center electronic devices 714 and 716.

Next, the base portion 706 (the stiffener ring 710) is mounted on the substrate 704 (in this example) to at least partially enclose the interposer 712 and data center electronic devices 714 and 716 within the volume 703. In some examples, mechanical fasteners or adhesive may be used to connect the stiffener ring 710 to the substrate 704.

Next, the top hat 722 is then mounted onto the stiffener ring 710 (and the thermal interface material 718) so that the bottom 728 is on top of the stiffener ring 710 and material 718. In some aspects, mechanical fasteners or adhesive may be used to connect the top hat 722 to the stiffener ring 710. Further, in some aspects, the top hat 722 may be mounted to the stiffener ring 710 on a component-by-component basis. For example, the bottom 728 may first be mounted to the stiffener ring 710 of the base portion 706. Next, the sides 726 may be mounted to the bottom 728. Next, the cap 724 may be mounted to the sides 726.

A number of embodiments have been described. Nevertheless, it will be understood that various modifications may be made without departing from the spirit and scope of what is described. For example, the steps of example operations of example methods and processes described herein may be performed in other orders, some steps may be removed, and other steps may be added. Accordingly, other embodiments are within the scope of the following claims.

What is claimed is:

1. A server tray package, comprising:
a motherboard assembly that comprises a plurality of data center electronic devices, the plurality of data center electronic devices comprising at least one heat generating processor device;
a liquid cold plate assembly that comprises:
a base portion mounted to the motherboard assembly, the base portion and motherboard assembly defining a volume that at least partially encloses the plurality of data center electronic devices, the base portion comprising a ring member that circumscribes the volume; and
a top portion coupled to the ring member and mounted to the base portion and comprising a perimeter member coupled to a heat transfer member shaped to thermally contact the heat generating processor device, the heat transfer member comprising an inlet port and an outlet port that are in fluid communication with a cooling liquid flow path defined through the heat transfer member, the ring member coupled to the perimeter member and comprising a thickness less than a thickness of the heat transfer member, the perimeter member integrally formed with the heat transfer member to at least partially define the cooling liquid flow path; and
a seal positioned between the heat transfer member and the plurality of data center electronic devices.

2. The server tray package of claim 1, wherein the liquid cold plate assembly further comprises a plurality of heat transfer surfaces enclosed within the cooling liquid flow path.

3. The server tray package of claim 1, wherein the seal comprises a thermal interface material positioned to directly contact a bottom surface of the top portion and a top surface of each of the plurality of data center electronic devices.

4. The server tray package of claim 3, wherein the thermal interface material comprises a metallization layer.

5. The server tray package of claim 4, wherein the liquid cold plate assembly further comprises a plurality of heat transfer surfaces enclosed within the cooling liquid flow path.

6. The server tray package of claim 5, wherein the metallization layer at least partially defines the cooling liquid flow path.

7. The server tray package of claim 6, wherein the metallization layer is positioned through a plurality of flow channels formed on a top surface of the heat generating processor device, the plurality of flow channels in fluid communication with the cooling liquid flow path.

8. The server tray package of claim 7, further comprising circulating the flow of cooling liquid through a plurality of flow channels formed on a top surface of the heat generating processor device, at least a portion of each of the plurality of flow channels filled with the metallization layer.

9. The server tray package of claim 1, further comprising another seal positioned between the ring member and the plurality of data center electronic devices.

10. The server tray package of claim 1, further comprising at least one mechanical fastener that couples the ring member to the top portion.

11. The server tray package of claim 1, wherein the seal comprises a metallization layer that at least partially defines the cooling liquid flow path.

12. The server tray package of claim 11, wherein the metallization layer is positioned through a plurality of flow channels formed on a top surface of the heat generating processor device, the plurality of flow channels in fluid communication with the cooling liquid flow path.

13. The server tray package of claim 12, further comprising a gasket mounted between a bottom surface of the heat transfer member and top surfaces of fins that define the plurality of flow channels formed on the top surface of the heat generating processor device.

14. The server tray package of claim 1, further comprising one or more fans mounted on or near the motherboard assembly.

15. The server tray package of claim 1, wherein the motherboard assembly comprises a motherboard, a silicon interposer, and a substrate.

16. A method for cooling heat generating devices in a data center, comprising:
circulating a flow of a cooling liquid to a server tray package that comprises:
a motherboard assembly that comprises a plurality of data center electronic devices that include at least one heat generating processor device; and a liquid cold plate assembly that comprises a base portion mounted to the motherboard assembly, the base portion and motherboard assembly defining a volume that at least partially encloses the plurality of data center electronic devices, and a top portion mounted to the base portion and comprising a heat transfer member shaped to thermally contact the heat generating processor device;
circulating the flow of the cooling liquid into an inlet port of the heat transfer member;
circulating the flow of the cooling liquid between the heat transfer member and a seal positioned between the heat transfer member and the heat generating processing device;
circulating the flow of the cooling liquid from the inlet port through a cooling liquid flow path defined through the heat transfer member to transfer heat from the at least one heat generating processor device to the cooling liquid; and
circulating the heated flow of the cooling liquid from the cooling liquid flow path to an outlet port of the heat transfer member.

17. The method of claim 16, wherein circulating the flow of the cooling liquid through the cooling liquid flow path defined through the heat transfer member comprises circulating the cooling liquid through a plurality of flow channels defined by a plurality of heat transfer surfaces enclosed within the cooling liquid flow path.

18. The method of claim 16, further comprising transferring the heat from the at least one heat generating processor device through the seal, the seal comprising a thermal interface material positioned to directly contact a bottom surface of the top portion and a top surface of the at least one heat generating processor device.

19. The method of claim 18, wherein the thermal interface material comprises a metallization layer.

20. The method of claim 19, further comprising circulating the heated flow of the cooling liquid through a portion of the cooling liquid flow path defined by a perimeter member of the top portion that is integrally formed with the heat transfer member and at least partially defines the cooling liquid flow path.

21. The method of claim 20, wherein the metallization layer at least partially defines the cooling liquid flow path.

22. The method of claim 21, further comprising circulating the flow of cooling liquid through a plurality of flow channels formed on a top surface of the heat generating processor device, at least a portion of each of the plurality of flow channels filled with the metallization layer.

23. The method of claim 22, wherein the plurality of flow channels are formed by fins or ridges.

24. The method of claim 16, further comprising circulating the heated flow of the cooling liquid through a portion of the cooling liquid flow path defined by a perimeter member of the top portion that is integrally formed with the heat transfer member and at least partially defines the cooling liquid flow path.

25. The method of claim 16, wherein the seal comprises a metallization layer that at least partially defines the cooling liquid flow path.

26. The method of claim 25, further comprising circulating the flow of cooling liquid through a plurality of flow channels formed on a top surface of the heat generating processor device, at least a portion of each of the plurality of flow channels filled with the metallization layer.

27. The method of claim 16, further comprising circulating a cooling airflow over the motherboard assembly.

28. The method of claim 16, wherein the motherboard assembly comprises a motherboard, a silicon interposer, and a substrate.

* * * * *